United States Patent [19]

Kinugawa

[11] Patent Number: 5,027,186
[45] Date of Patent: Jun. 25, 1991

[54] SEMICONDUCTOR DEVICE

[75] Inventor: Masaaki Kinugawa, Tokyo, Japan

[73] Assignee: Kabushiki Kaisha Toshiba, Kawasaki, Japan

[21] Appl. No.: 473,436

[22] Filed: Feb. 1, 1990

[30] Foreign Application Priority Data

Feb. 2, 1989 [JP] Japan .................................. 1-24546

[51] Int. Cl.⁵ .............................................. H01L 29/04
[52] U.S. Cl. ..................... 357/59; 357/23.3; 357/23.5; 357/41; 357/51
[58] Field of Search ............ 357/23.5, 51, 59 F, 357/41, 23.3

[56] References Cited

U.S. PATENT DOCUMENTS

| 4,370,798 | 2/1983 | Lien et al. | 357/59 F |
| 4,717,941 | 1/1988 | Yamazaki | 357/51 |
| 4,755,480 | 7/1988 | Yau et al. | 357/51 |
| 4,797,717 | 1/1989 | Ishibashi et al. | 357/51 |
| 4,835,589 | 5/1989 | Pfiester | 357/51 |
| 4,907,057 | 3/1990 | Ariizumi et al. | 357/51 |

FOREIGN PATENT DOCUMENTS

| 56-688351 | 7/1981 | Japan | 357/51 |
| 59-201463 | 11/1984 | Japan | 357/51 |
| 63-54770 | 3/1988 | Japan | 357/23.3 |

Primary Examiner—Rolf Hille
Assistant Examiner—Steven Loke
Attorney, Agent, or Firm—Banner, Birch, McKie & Beckett

[57] ABSTRACT

A static random access memory comprises a first power source, a second power source, a first resistor connected at one end to the first power source, a second resistor connected at one end to the first power source, a first FET including a first source connected to the second power source, a first drain connected to the other end of the first resistor, and a first gate arranged in parallel and electrically connected to the second resistor, via an insulating film, thereby varying a resistance value of the second resistor, and a second FET including a second source connected to the second power source, a second drain connected to the other end of the second resistor, and a second gate arranged in parallel and electrically connected to the first resistor, via an insulating film, thereby varying a resistance value of the first resistor.

11 Claims, 5 Drawing Sheets

SEMICONDUCTOR DEVICE

BACKGROUND OF THE INVENTION

1. Field of the Invention

The present invention relates generally to a semiconductor device employing a M (metal)-I (insulator)S (semiconductor) type FET (field-effect transistor), and more particularly to a semiconductor device used in a memory cell using a high-resistance element as a load in a static RAM (random-access memory).

2. Description of the Related Art

Figures 2, 5A, 5B:
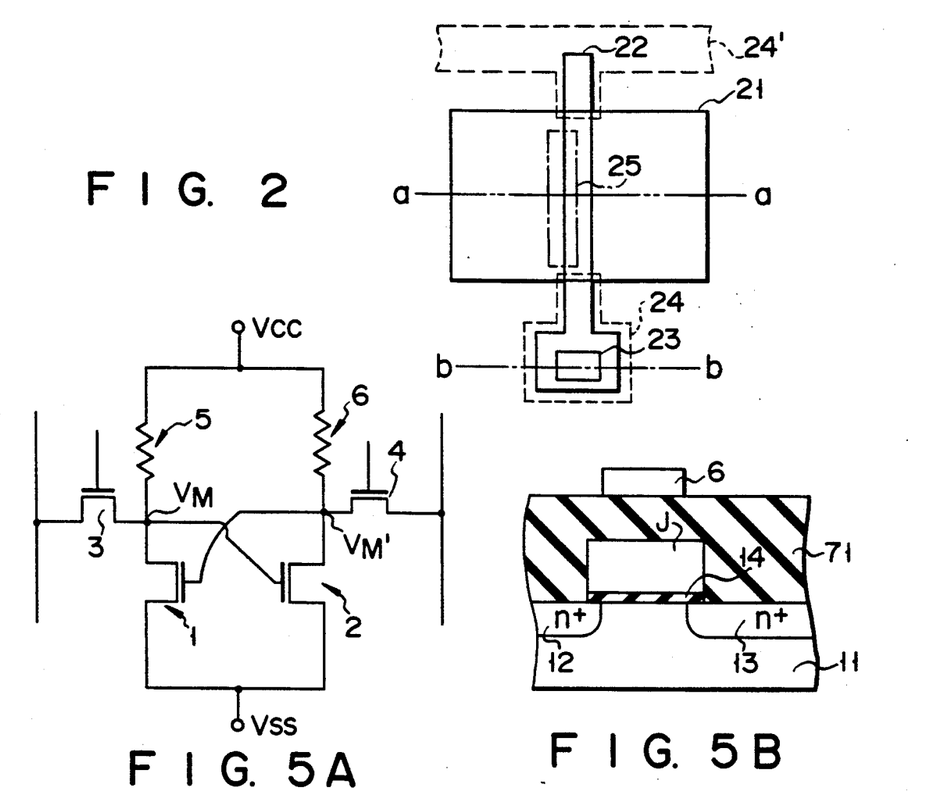
FIG. 2 is a plan view showing an area of the resistor portion shown in FIG. 1C.
FIG. 5A is a circuit diagram showing a memory cell of a conventional static RAM.
FIG. 5B is a cross-sectional view of the memory cell shown in FIG. 5A.

FIG. 5 shows a conventional so-called E/R (enhancement/resistance) type static RAM memory cell using a high-resistance element This memory comprises four transistors 1 to 4 and two constant-resistance resistors 5 and 6. These elements constitute a flip-flop.

Two problems must be considered in increasing the capacitance of a semiconductor memory device:

(1) Increase in standby current, and (2) Instability in operation due to the increase in voltage drop caused by a load resistance.

In FIG. 5, if a node potential VM is set to a high level, e.g., a 5 V, a node potential VM' is set to a low level, e.g., about 0 V. In this case, the driver transistor 2 is turned on, and a leak current flows through a path constituted by a power source voltage Vcc, the high-resistance resistor 6 (the resistance is R), the driver transistor 2, and a ground voltage Vss. A standby current Isb of the static RAM is calculated by multiplying the leak current by the number of memory cells. Accordingly, the resistance R of the resistors 5 and 6 must satisfy the following condition:

$$R \geq \frac{Vcc}{I_{sb}/N} \quad (1)$$

(N: number of cell)

For example, when Vcc=5 V, N=1 megabit ($10^6$), and Isb is designed to 2 μA or less, the following condition must be satisfied $$R \geq 2.5 \times 10^{12} (\Omega) \quad (2)$$

The lower limit value in this condition is further raised in accordance with the degree of integration of the memory device. This is because the number of cells N is increased in accordance with the increase in capacitance of the memory device, while the value of the standby current Isb, which is required as a finished product, must be unchanged. Namely, this is the first problem, or the increase in standby current. In order to solve the first problem, there is a step of increasing the resistance value of the resistors 5 and 6. By increasing the resistance value, the standby current per cell (one flip-flop) is decreased in an adversely proportional manner. Thus, the standby current of the entire memory device can be limited to the value required by design specifications.

However, if the resistance values of resistors 5 and 6 are increased, the voltage drop is caused by the resistors accordingly. As a result, the node voltage $V_M$ lowers, and the operation of the driver transistors 1 and 2 become unstable. Namely, this is the second problem.

In order to solve the second problem, or the instability in operation due to the voltage drop, the following method has been proposed According to this method, the off-resistance r of driver transistor 1 and 2 is increased. If the off-resistance of the driver transistor 1 (in the OFF state) is r, the following equation can be established:

$$V_M = \frac{r}{r+R} Vcc$$

Figure 6:
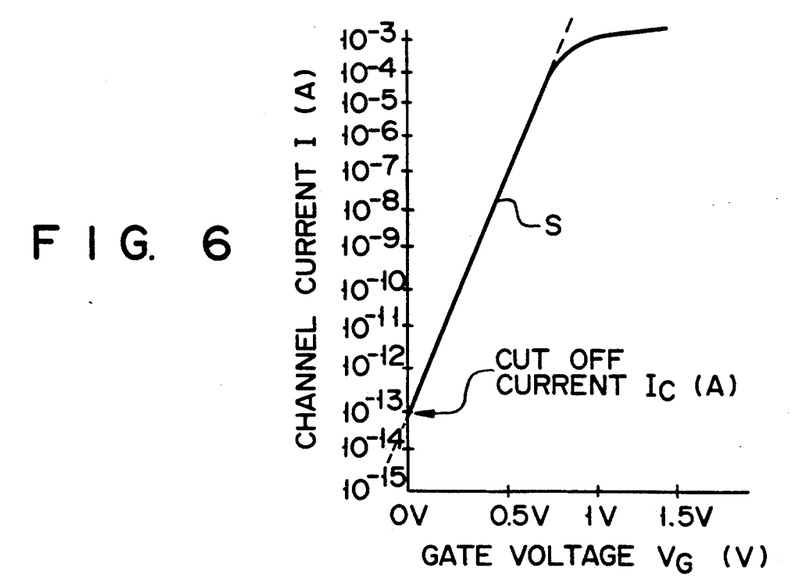
FIG. 6 is a graph showing characteristics of the cell shown in FIG. 5A.

In order to establish the relationship, $V_M \approx Vcc$, the relationship, r>>R, must be established Normally, in order to obtain the value of $V_M$, i.e. $V_M \geq 0.99$ Vcc, which is necessary for ensuring the stable operation of the memory device, the following relationship must be established:

On the other hand, the off-resistance r is give by the equation:

$$r \geq 100 \times R \quad (4)$$

by using a cut-off current Ic which is obtained when the gate voltage VG of the sub-threshold characteristic of the channel current shown in FIG. 6 is 0 V.

The cut-off current Ic is represented by;

$$I_C = 10^{(-6-\frac{V_{TH}}{S})} \quad (5)$$

when the threshold value of the transistor (i.e. the gate voltage for causing a current of 1 μA to flow) is set to VTH by using the so-called "sub-threshold slope" S (V/decade). The sub-threshold slope S (V/decade) is an inverse number of inclination of a straight portion S in FIG. 6, symbol V denotes a gate voltage, and "decade" is the number of digits of channels.

From formula (1) to (5), the following condition for $V_{TH}$ is given:

$$V_{TH} \geq S \log (50N) \quad (6)$$

For example, in the case of a 1 M-bit static RAM (N=106), if a typical value of S, i.e., 0.1 (V/decade), is used, the following necessary condition is given:

$$V_{TH} = 0.77 V \quad (7)$$

Regarding this condition, the lower limit value is not lowered, rather, may be increased, in consideration of the fact that the value N increases in accordance with the increase in the degree of integration and capacitance, and that the value S does not change, irrespective of scaling rules. Accordingly, the value $V_{TH}$ of the static RAM increases, in the reverse direction to the direction of the scaling rule (or does hardly change). This tendency leads to an remarkable increase in concentration of channel region impurity (the thickness of a gate oxide film may be reduced in accordance with the degree of integration). The remarkable increase in concentration of channel region impurity intensifies the substrate bias effect of transfer gates 3 and 4 in the circuit shown in FIG. 5, since the transfer gates 3 and 4 are formed along with the transistors 1 and 2. In addition, the write-in in high level cannot be attained, degrading the characteristic of the cells. Furthermore, the amount of hot carriers is increased, and a reliable E/R type static RAM cannot be obtained.

From the above, it is understood that there are drawbacks in the method of solving the problem by increasing the off-resistance of driver transistors 1 and 2 and changing the threshold value.

SUMMARY OF THE INVENTION

The present invention aims at preventing the increase of standby current, thereby increasing the storage capacity of a semiconductor device, in particular, in a static RAM, and also aims at preventing the instability in operation due to a voltage drop caused by the increase in resistance value of a load resistor in a memory cell circuit.

The present invention provides a static random access memory comprising: a first power source; a second power source; a first resistor connected at one end to the first power source; a second resistor connected at one end to the first power source; a first FET including a first source connected to the second power source, a first drain connected to the other end of the first resistor, and a first gate arranged in parallel and electrically connected to the second resistor, via an insulating film thereby varying a resistance value of the second resistor; and a second FET including a second source connected to the second power source, a second drain connected to the other end of the second resistor, and a second gate arranged in parallel and electrically connected to the first resistor, via an insulating film, thereby varying a resistance value of the first resistor.

According to he present invention, there is provided a static RAM wherein power consumption is not increased, and the operation of the device cannot be made unstable due to a voltage drop caused by the increase in resistance value of a load resistor in a memory cell circuit. In accordance with the increase in storage capacity of an SRAM, it becomes necessary to reduce a standby current to be consumed in each flip-flop.

Suppose that, regarding the operation of the SRAM, the drain potential of a first FET is set in a high level, and the drain potential of a second FET is in a low level. In this case, a main current in the flip-flop flows through a second resistor and the second FET to a second power source. In accordance with the decrease in this current, the power consumption in each flip-flop, i.e., the standby current, decreases. As a result, the power consumption in a finished device decreases, while the storage capacity of the device can be increased. Thus, the higher the resistance value of the second resistor (or, the lower the current value of the same), the less the power consumption. Namely, it is desirable that the resistance value of the lower potential side of the flip-flip circuit be high.

On the other hand, if the resistance value of the first resistor of the high potential side is too high, the voltage drop occurs accordingly, and the potential of the gate of the second FET decreases. If this tendency continues, the operation of the second FET becomes unstable and the reliability of the flip-flop is lowered. In order to avoid the voltage drop, it is thus desirable that the resistance value of the high potential side of the flip-flop be low.

However, because of the operation of a flip-flop, two load resistors have high and low levels alternately. According to the structure of the present invention, the first resistor is provided in parallel to the gate of the second FET with the thin oxide insulating film interposed, and the second resistor is similarly provided in parallel to the gate of the first FET with the thin oxide insulating film interposed. The thickness of the oxide insulating film is reduced so that the potential of the gate can exert an influence of electric field upon the adjacent resistor element. In other words, when the potential of the gate is high, i.e., logical "1", negative carriers are induced in the adjacent resistor to facilitate the flow of electrons, as a result of which the resistance value decreases. Inversely, when the potential of the gate is low, i.e., logical "0", the adjacent resistor is free from the influence of electric field by the gate, and the initially set high resistance value is maintained.

Since the resistors designed to ensure the above operation are employed, the resistor having the high level during the operation suffers the influence of electric field of the high-level gate of the adjacent FET, and the resistance value thereof is reduced. As a result, the voltage drop due to the resistor can be avoided. Therefore, the potential at the gate of the FET can be prevented from undesirably lowering, and the stable operation of the FET can be ensured. On the other hand, the resistor having the low level during the operation is free from the influence of electric field of the low-level gate of the adjacent FET, and the high resistance thereof determined in the design process can be maintained. The electric current flowing in the resistor is reduced, the power consumed in each flip-flop can be reduced, and the storage capacity of the SRAM can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will now be described with reference to the accompanying drawings.

Figure 1A:
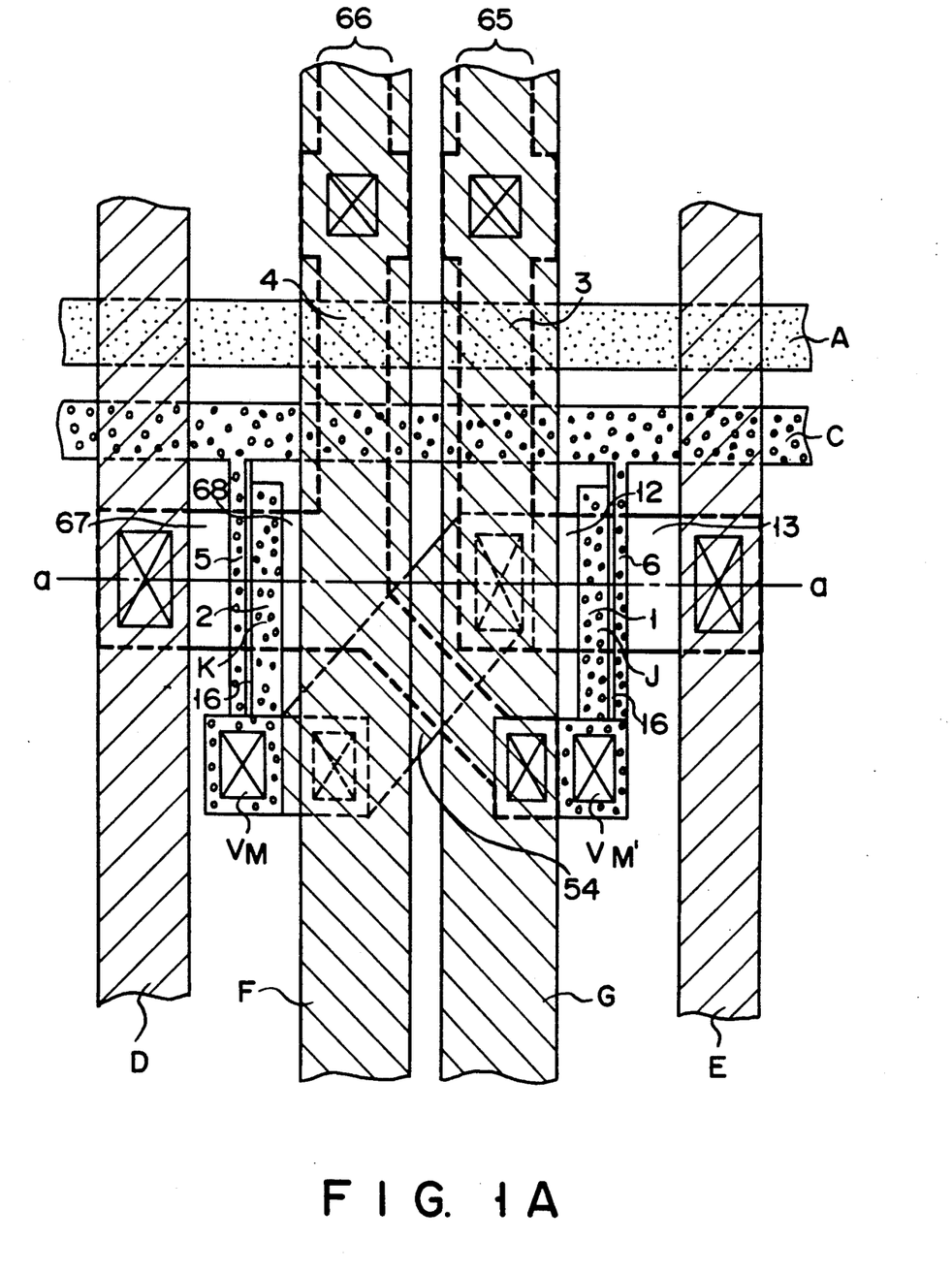
FIG. 1A is a plan view showing a pattern of a semiconductor device according to an embodiment of the present invention.
Figure 1B:
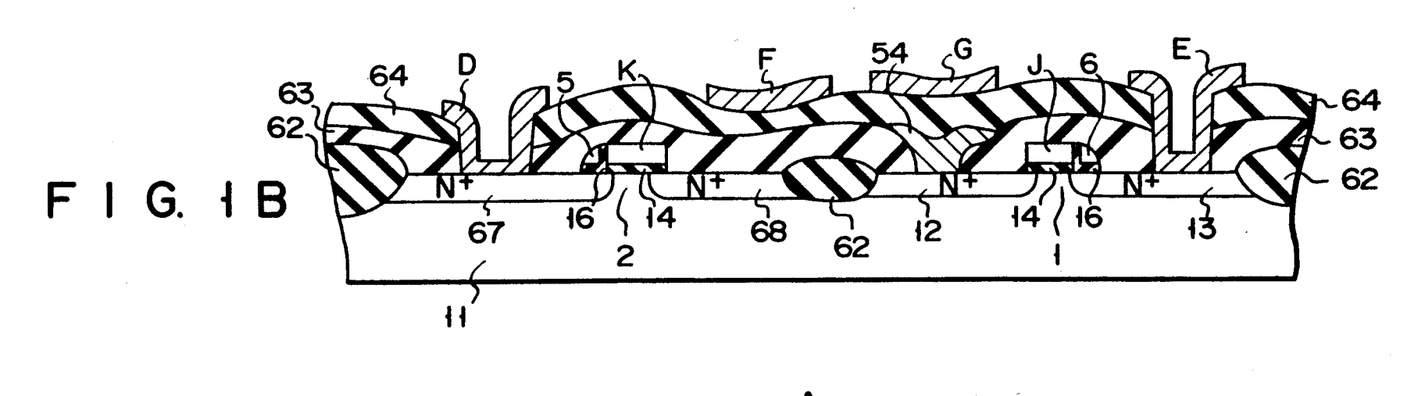
FIG. 1B is a cross-sectional view taken along line a—a in FIG. 1A.
Figure 1C:
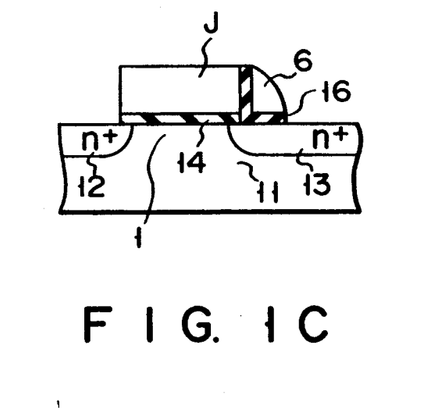
FIG. 1C is a cross-sectional view showing a resistor portion of the embodiment shown in FIG. 1A.
Figure 1D:
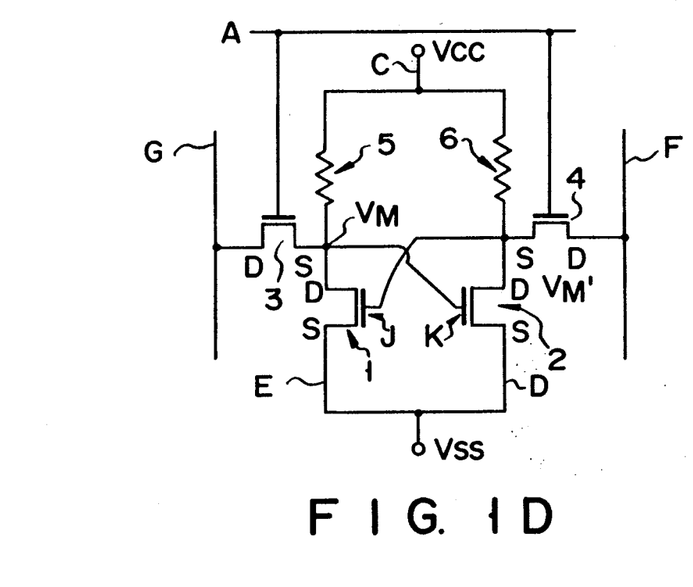
FIG. 1D is a circuit diagram of the embodiment shown in FIG. 1A.

FIG. 1A is a plan view showing a pattern of the semiconductor device according to an embodiment of a present invention, FIG. 1B is a cross-sectional view taken along line A—A in FIG. 1A, FIG. 1C is a cross-sectional view showing a resistor portion of the embodiment shown in FIG. 1A, and FIG. 1D is a circuit diagram of the embodiment shown in FIG. 1A.

More particularly, FIG. 1D shows a memory cell of an SRAM wherein a word line A and bit lines G and F are connected to a flip flop circuit. Symbol Vcc denotes a positive power source, and Vss a ground power source. Resistor elements 5 and 6 are connected to the power source Vcc. MOSFETs 1 and 2 are connected to the resistor elements 5 and 6. Symbols J and K denote gate electrodes, and VM and VM' nodes resistor elements 5 and 6 and the drains of MOSFETs 1 and 2. The gates of FETs 3 and 4 are connected to the word line A, and data is input to and output from the FETs 3 and 4 in accordance with the signal flowing in the word line A. Symbols C, D and E are used for clarifying the corresponding portions in FIG. 1A.

In FIGS. 1A and 1B, a semiconductor pattern is formed on a semiconductor substrate 11, and the same reference numerals as appear in FIG. 1D are used.

A MOSFET 1 comprises N-type regions 12 and 13 formed in an area surrounded by element regions 65, and a gate electrode J formed over a region between the N-type regions 12 and 13 with an insulating film 14 interposed. A resistor region 6 is formed on a side portion of the gate electrode J with an insulating film 16 interposed. The resistor region 6 determines a standby current. However, when the resistance value of the resistor region 6 is too high, a voltage drop increases, compared to the resistance value, and the voltage applied to the gate J decreases. As a result, the operation of the FET becomes unstable. In order to avoid this, when the potential of gate J is high, negative carriers are induced in the resistor element 6 owing to the influence by the electric field of gate J, and the resistor element 6 is set in the "ON" state, that is, in the low resistance state. Consequently the voltage drop decreases, and the sufficiently high voltage is applied to the base of the FET. Thus, the operation of the FET is stabilized.

A MOSFET 2 comprises N-type regions 67 and 68 formed in an area surrounded by element regions 66, and a gate electrode K formed over a region between the N-type regions 67 and 68 with an insulating film 14 interposed. A resistor region 5 is formed on a side portion of the gate electrode K with an insulating film 16 interposed. The resistor region 5 determines a standby current. The resistor region 5 functions in the same manner as the resistor region 6, and the operation of the FET is stabilized.

Reference numeral 54 denotes a wiring layer at which the flip-flops cross, and numeral 62 denotes a thermal oxide film for separating the element regions 65 and 66. Numerals 63 and 64 indicate insulating layers. Wiring layers 54, D, E, F, and G are formed of aluminum, or the like.

FIG. 1C is a cross-sectional view showing a semiconductor pattern of the MOSFET 1. As shown in FIG. 5B, in the resistor element 6 of a conventional flip-flop the gate electrode J and the resistor element 6 are insulated from each other by an insulating film 71, so as to avoid mutual interference. In the present invention, the thin insulating film 16 is provided between the electrode J and the resistor element 6, so that the potential of the electrode J can vary the resistance value of the resistor element 6. Thus, the resistance value of the resistor element 6 can be set to an optimal value, and power consumption is reduced, while the stable operation of the flip-flop is ensured.

FIG. 2 is a plan view showing an area of the resistor portion shown in FIG. 1C, and FIGS. 3A to 3E and FIGS. 4A to 4E are cross-sectional views illustrating the steps of manufacturing the semiconductor device according to the present invention. FIGS. 3A to 3E are taken along line a—a in FIG. 2, and FIGS. 4A to 4E are taken along line b—b in FIG. 2. The steps for manufacturing the semiconductor device shown in FIG. 1 will now be described.

In FIG. 2, reference numeral 21 denotes an element region. The element region 21 is surrounded by an element separation region. Numeral 22 denotes a gate electrode, and numeral 23 denotes a contact portion between the gate electrode 22 and a highresistance element (e.g., element 5 in FIG. 5A). Resist patterns 24 and 24' serve to form polysilicon side walls, and a hole pattern 25 is formed in the resist and is used to eliminate the polysilicon side walls.

Figure 3A:
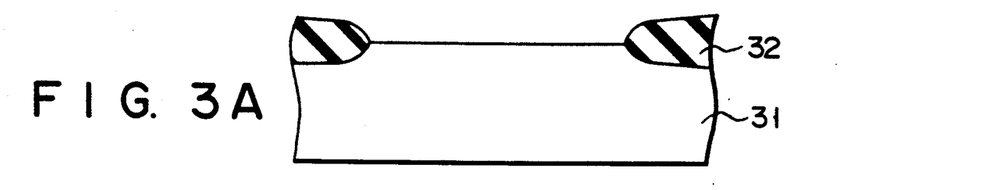
FIGS. 3A to 3E and FIGS. 4A to 4E are cross-sectional views illustrating the steps of maufacturing the semiconductor device according to the present invention.
Figure 3B:
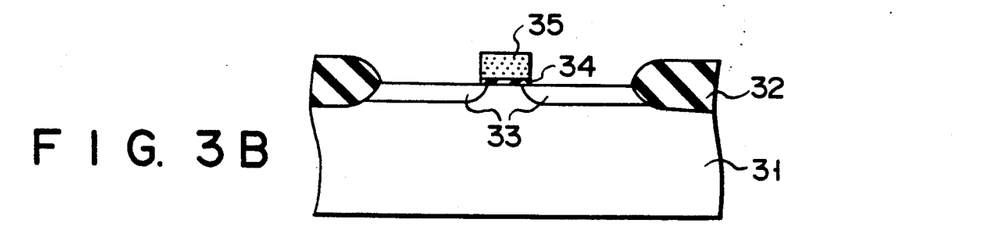
Figure 3C:
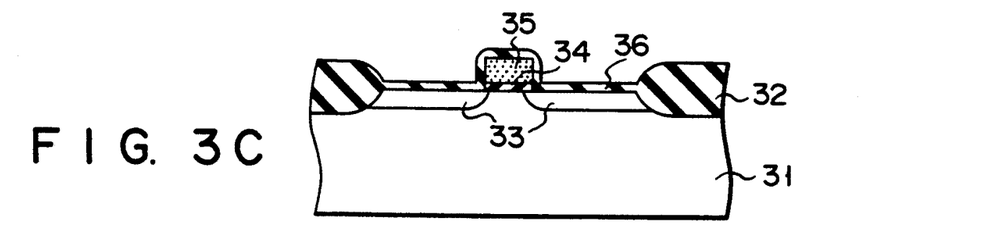
Figure 3D:
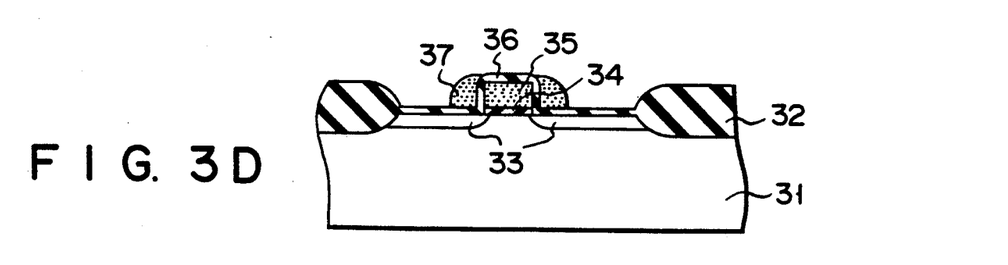
Figure 3E:
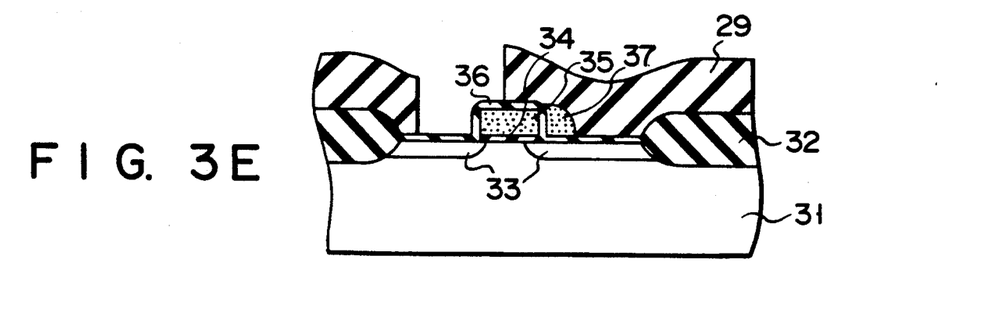
Figure 4A:
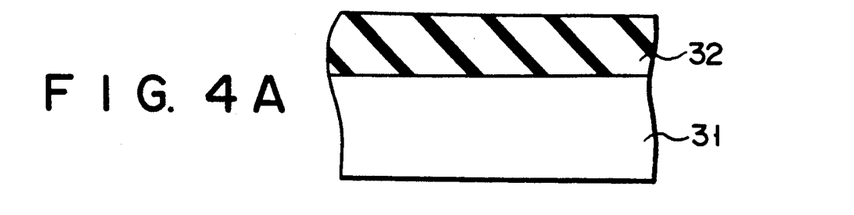
Figure 4B:
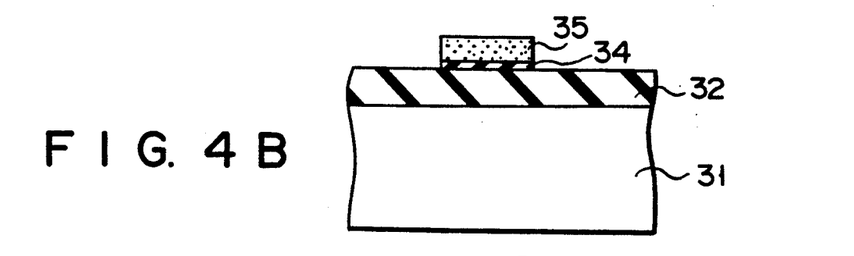
Figure 4C:
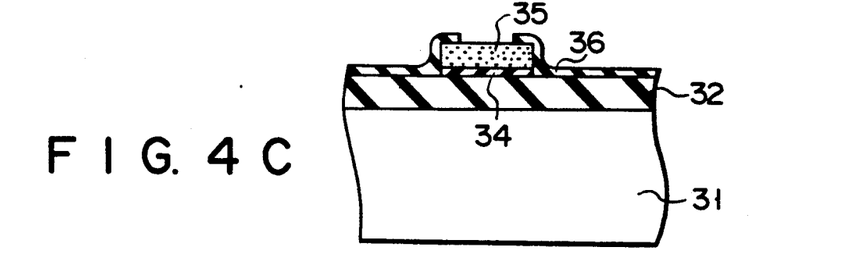
Figure 4D:
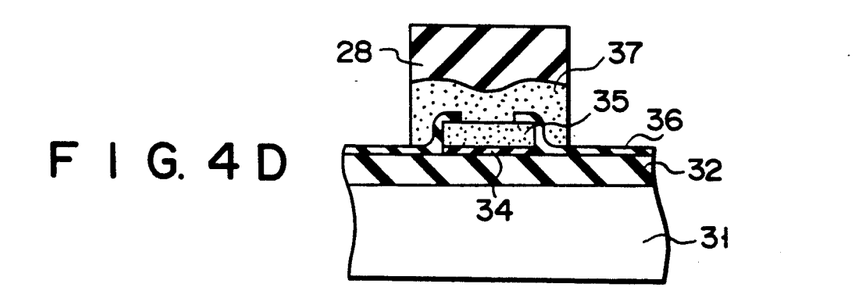
Figure 4E:
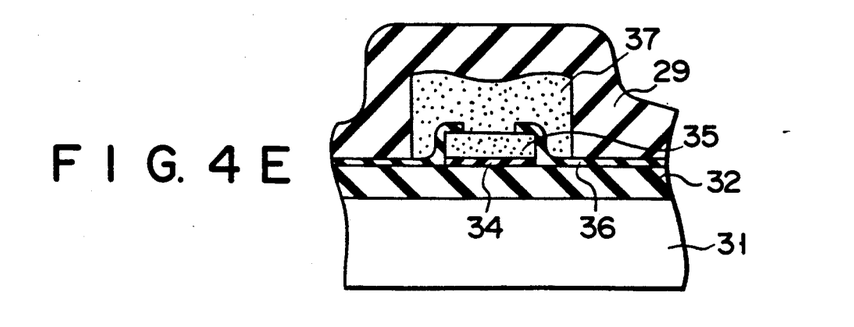

First, an N-type well (not shown) is formed in a P-type substrate 31 to manufacture a PMOSFET of a peripheral circuit. Then, a field-oxide film 32 is formed by a LOCOS (local oxidation of silicon) method (FIGS. 3A and 4A). A gate oxide film 34 having a thickness of 150 Å is formed in a dry $O_2$ atmosphere at a temperature of 900° C. Subsequently, a polysilicon layer 35 having a thickness of 4,000 Å. Phosphorus is diffused in a POCl atmosphere at 900° C., and a gate electrode is patterned through a lithographic process. Source and drain regions 33 are formed by injecting arsenic ions only in the NMOS region with a dose amount of $5 \times 10^{15}$ cm$^{-2}$ and with an acceleration voltage of 50 keV, and by injecting BF2 ions only in the PMOS region of peripheral circuits with a dose amount of $5 \times 10^{15}$ cm$^{-2}$ and with an acceleration voltage of 50 keV (FIGS. 3B and 4B). An oxide (SiO$_2$) film 36 is formed by subjecting the resulting body in a dry $O_2$ atmosphere for ten minutes at 900° C. It is desirable that the thickness of the oxide film be 150 to 170 Å. A perforated resist pattern is formed by means of lithography in the region indicated by numeral 23 in FIG. 2. After the SiO$_2$ film 36 on the region 23 is removed by means of anisotropic etching, the resist is removed (FIGS. 3C and 4C). A polysilicon layer 37 (forming a side wall) with a thickness of 4,000 Å is deposited. While a resist is left on the regions indicated by numerals 24 and 24' in FIG. 2, the resulting body is subjected to anisotropic etching to leave a polysilicon 37 (FIGS. 3B and 4D). After the resist 28 is removed, a resist pattern having a hole only in the regions indicated by numerals 24, 24' and 25 in FIG. 2 is formed. Then, arsenic ions are injected with an acceleration voltage of 50 keV and with a dose of $5 \times 10^{15}$ cm$^{-2}$. The ions are injected in the regions 24 and 24' in order to form a low-resistance wiring region, and the ions are injected in the region 25 in order to increase an etching rate of polysilicon in the subsequent step of removing the side wall. After the resist is removed, an annealing step is carried out in an N$_2$ atmosphere at 900° C. for 10 minutes to activate the injected arsenic. After a resist pattern 29 having a hole only in an area corresponding to the region indicated by numeral 25 in FIG. 2 is formed, a polysilicon side wall in this region is removed by means of isotropic etching and only one-side polysilicon wall 6 is left (FIGS. 3E and 4E). Thereafter, a normal process of Al wiring is performed.

In this manner, a static RAM cell having enhanced cell characteristics, while reducing the standby current Isb, has been obtained without increasing the cell area. Suppose that FIG. 1 illustrates the driver transistor 2 shown in FIG. 5. When the node voltage Vm is in a low level, the gate electrode K is set in a low level and is about 0 V. In this case, an n+region 13 is connected to the ground potential Vss, and has a potential of 0 V. Thus, the polysilicon side walls 5 and 6 are surrounded by the walls with 0 V. Namely, the polysilicon side walls 5 and 6 are in the "OFF" state, i.e., in the high-resistance state. The side walls 5 and 6 serve as normal high-value resistors (R$\Omega$) and satisfies formula (1). The high-value resistor is used as resistor 5 in FIG. 5. In this case, even if the node voltage VM' is in a high level (about 5 V) and the driver transistor 1 is turned on, the value r of the high-value resistor 5 is sufficiently great and the standby current Isb can be limited to 2 $\mu$A or less. On the other hand, suppose that FIG. 1 illustrate the driver transistor 1 shown in FIG. 1. In this case, since the node voltage VM' is in the high level, the gate electrode J is in the high level and has a potential of about 5 V. In this case, the n+ region 13 is connected to the ground potential Vss of 0 V. Since the potential of the gate electrode J is 5 V and the substrate potential is 0 V, negative carriers are induced in the side wall 6 by the function of gate J, and the side wall 6 is set in the "ON" state, i.e., in a low-resistance state. The resistance value of the side wall 6 is R'=$10^{-2}$R which is lower than R. For example, the resistance of 2.5 T$\Omega$ (Teraohms=$10^{12}$ ohms) is lowered to 25 G$\Omega$, (Gigaohms=$10^9$ ohms) and the cut-off current Ic of the transfer gate/transistor, which satisfies the formula (3), is obtained even if the threshold of transfer gate 4 is low. Thus, the problems in the prior art can be solved.

The present invention is not limited to the above-described embodiment, and various modifications can be made. For example, in the above embodiment, the side wall resistor 5 (6) was made of polysilicon; however, it may be made of single-crystal silicon.

As has been described above in detail, the present invention can provide a memory, cell in which the resistance value of the resistor formed on the side wall of the gate is made variable. When this resistor is used as a load resistor of a memory cell of a static RAM, a standby current can be reduced without increasing the area of the cell.

Additional advantages and modification will readily occur to those skilled in the art. Therefore, the invention in its broader aspects is not limited to the specific details, representative devices, and illustrated examples shown and described wherein. Accordingly, various modifications may be made without departing from the spirit or scope of the general inventive concept as defined by the appended claims and their equivalents.

What is claimed is:

1. A static random access memory comprising:
   a first power source;
   a second power source;
   a first MOS transistor structure having a first gate, a first source connected to the second power source, and a first drain;
   a second MOS transistor structure having a second gate connected to the first drain of said first MOS transistor structure, a second source connected to the second power source, and a second drain connected to the first gate of said first MOS transistor structure and the first power source;
   a first resistor connected between the first gate of said first MOS transistor structure and the first power source and substantially formed only over the first source of said first MOS transistor; and
   a second resistor connected between the second gate of said second MOS transistor structure and the first power source and substantially formed only over the second source of said second MOS transistor;
   wherein said first resistor is arranged to the first gate so that an electrical field generated from the first gate modifies a resistance of said first resistor, and said second resistor is arranged adjacent to the second gate so that an electrical field generated from the second gate modifies a resistance of said second resistor.

2. A static random access memory according to claim 1, further comprising:
   a third MOS transistor structure having a third source connected to said first drain of said MOS transistor structure, thereby connecting said static random access memory to an external section in one operative state, and disconnecting said static random access memory from the external section in another operative state; and
   a fourth MOS transistor structure having a fourth source connected to said second drain of said second MOS transistor structure, thereby connecting said static random access memory to an external section in one operative state, and disconnecting said static random access memory from the external section in another operative state.

3. A static random access memory according to claim 2, further comprising:
   bit lines connected to said third drain of said third MOS transistor structure and said fourth drain of said fourth MOS transistor structure; and
   a word line connected to said third gate of said third MOS transistor structure and said fourth gate of said fourth MOS transistor structure.

4. A static random access memory according to claim 1, wherein said first resistor is electrically coupled by an insulating film to said first gate, and said second resistor is electrically coupled by an insulating film to said second gate, whereby a thickness of said insulating films is 150 Å to 170 Å.

5. A static random access memory according to claim 1, wherein a resistance value of said first resistor and said second resistor, in their high resistance state, is substantially about 2.5 Teraohms.

6. A static random access memory according to claim 1, wherein a resistance value of said first resistor and said second resistor, in their low resistance state, is substantially about 25 Gigaohms.

7. A static random access memory according to claim 1, wherein said first resistor and said second resistor contain polysilicon.

8. A static random access memory according to claim 1, wherein said first resistor and said second resistor contain a single crystal silicon.

9. A static random access memory comprising:
   a first power source;
   a second power source;
   a first MOS transistor structure having a first gate, a first source connected to the second power source, and a first drain;

a second MOS transistor structure having a second gate connected to the first drain of said first MOS transistor structure, a second source connected to the second power source, and a second drain connected to the first gate of said first MOS transistor structure and the first power source;

a first resistor connected between the first gate of said first MOS transistor structure and the first power source and substantially formed only over the first source of said first MOS transistor; and a second resistor connected between the second gate of said second MOS transistor structure and the first power source and substantially formed only over the second source of said second MOS transistor;

wherein said first resistor is arranged adjacent to the first gate so that an electrical field generated from the first gate modifies a resistance of said first resistor, and said second resistor is arranged adjacent to the second gate so that an electrical field generated from the second gate modifies a resistance of said second resistor;

a third MOS transistor structure having a third source connected to said first drain of said first MOS transistor structure and serving to input a signal to an external section of said static random access memory in one operative state, and output a signal from an external section of said static random access memory in another operative state;

a fourth MOS transistor structure having a fourth source connected to said second drain of said second MOS transistor structure and serving to input a signal to an external section of said static random access memory in one operative state, and output a signal from an external section of said static random access memory in another operative state;

bit lines connected to said third drain of said third MOS transistor structure and said fourth drain of said fourth MOS transistor structure; and a word line connected to said third gate of said third MOS transistor structure and said fourth gate of said fourth MOS transistor structure.

10. A static random access memory according to claim 9, wherein said first resistor is electrically coupled by an insulating film to said first gate, and said second resistor is electrically coupled by an insulating film to said second gate, whereby a thickness of said insulating films is 150 Å to 170 Å.

11. A static random access memory comprising:
a first power source;
a second power source;
a first MOS transistor structure having a first gate, a first source connected to the second power source, and a first drain;

a second MOS transistor structure having a second gate connected to the first drain of said first MOs transistor structure, a second source connected to the second power source, and a second drain connected to the first gate of said first MOS transistor structure and the first power source;

a first resistor connected between the first gate of said first MOS transistor structure and the first power source and substantially formed only over the first source of said first MOS transistor structure;

a second resistor connected between the second gate of said second MOS transistor structure and the first power source and substantially formed only over the second source of said second MOS transistor structure;

first means arranged adjacent to said first gate and said first resistor, for modifying a resistance of said first resistor so that the resistance of said first resistor substantially linearly changes in response to a potential of the first gate of said first MOS transistor structure; and second means arranged adjacent to said second gate and said second resistor, for modifying a resistance of said second resistor by an electrical field generated from the second gate so that the resistance of said second resistor substantially linearly changes in response to a potential of the second gate of said second MOS transistor structure.

* * * * *